(12) United States Patent
Okada et al.

(10) Patent No.: US 7,986,021 B2
(45) Date of Patent: Jul. 26, 2011

(54) SEMICONDUCTOR DEVICE

(75) Inventors: Kazuo Okada, Gunma (JP); Katsuhiko Kitagawa, Gunma (JP); Takashi Noma, Gunma (JP); Shigeki Otsuka, Chiba (JP); Hiroshi Yamada, Gunma (JP); Shinzo Ishibe, Gunma (JP); Yuichi Morita, Gunma (JP); Noboru Okubo, Saitama (JP); Hiroyuki Shinogi, Gunma (JP); Mitsuru Okigawa, Aichi (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 11/639,410

(22) Filed: Dec. 15, 2006

(65) Prior Publication Data

US 2007/0145420 A1 Jun. 28, 2007

(30) Foreign Application Priority Data

Dec. 15, 2005 (JP) ................................. 2005-361706
Nov. 16, 2006 (JP) ................................. 2006-310623

(51) Int. Cl.
*H01L 31/0232* (2006.01)

(52) U.S. Cl. ........ 257/436; 257/437; 257/435; 257/687; 257/E31.122; 257/E27.122; 257/E25.004

(58) Field of Classification Search .................. 257/659, 257/433, 435–437, 290–294, E31.122
See application file for complete search history.

(56) References Cited

U.S. PATENT DOCUMENTS

| 4,242,695 | A | * | 12/1980 | Ouchi et al. ............... 257/292 |
| 5,656,816 | A | * | 8/1997 | Tanaka ..................... 250/339.01 |
| 5,804,827 | A | * | 9/1998 | Akagawa et al. ......... 250/370.06 |
| 5,929,440 | A | * | 7/1999 | Fisher ....................... 250/338.1 |
| 5,973,337 | A | * | 10/1999 | Knapp et al. ................ 257/99 |
| 6,165,814 | A | | 12/2000 | Wark et al. |
| 6,228,676 | B1 | * | 5/2001 | Glenn et al. ................ 438/107 |
| 6,229,223 | B1 | * | 5/2001 | Watanabe ................... 257/795 |

(Continued)

FOREIGN PATENT DOCUMENTS

JP          5-21698          1/1993

(Continued)

OTHER PUBLICATIONS

Horikoshi, K. et al., U.S. Office Action, mailed Feb. 19, 2009, directed to a related U.S. Appl. No. 12/103,857; 8 pages.

(Continued)

*Primary Examiner* — Lynne A Gurley
*Assistant Examiner* — Jesse Y Miyoshi
(74) *Attorney, Agent, or Firm* — Morrison & Foerster LLP

(57) ABSTRACT

The invention provides a semiconductor device that solves a problem of reflection of a pattern of a wiring formed on a back surface of a semiconductor substrate on an output image. A reflection layer is formed between a light receiving element and a wiring layer, that reflects an infrared ray toward a light receiving element the without transmitting it to the wiring layer, the infrared ray entering from a light transparent substrate toward the wiring layer through a semiconductor substrate. The reflection layer is formed at least in a region under the light receiving element uniformly or only under the light receiving element. Alternatively, an anti-reflection layer having a function of absorbing the entering infrared ray to prevent transmission thereof may be formed instead of the reflection layer.

12 Claims, 6 Drawing Sheets

U.S. PATENT DOCUMENTS

| | | | |
|---|---|---|---|
| 6,326,689 B1* | 12/2001 | Thomas | 257/734 |
| 6,372,351 B1* | 4/2002 | Takemiya et al. | 428/416 |
| 6,384,459 B1* | 5/2002 | Matsuda | 257/435 |
| 6,455,774 B1 | 9/2002 | Webster | |
| 6,465,786 B1* | 10/2002 | Rhodes | 250/338.4 |
| 6,552,344 B1* | 4/2003 | Sone et al. | 250/338.4 |
| 6,563,192 B1 | 5/2003 | Corisis et al. | |
| 6,646,289 B1* | 11/2003 | Badehi | 257/81 |
| 6,693,337 B2 | 2/2004 | Yoneda et al. | |
| 6,717,147 B2 | 4/2004 | Oda | |
| 6,838,748 B2 | 1/2005 | Ishio et al. | |
| 7,102,238 B2 | 9/2006 | Noma et al. | |
| 7,183,589 B2 | 2/2007 | Kameyama et al. | |
| 7,274,101 B2 | 9/2007 | Tomita et al. | |
| 7,332,783 B2 | 2/2008 | Misawa | |
| 7,332,789 B2 | 2/2008 | Violette | |
| 7,374,971 B2 | 5/2008 | Yuan et al. | |
| 7,374,972 B2 | 5/2008 | Kwon et al. | |
| 7,413,931 B2 | 8/2008 | Noma et al. | |
| 7,569,409 B2 | 8/2009 | Lin et al. | |
| 7,576,361 B2* | 8/2009 | Agranov et al. | 257/66 |
| 7,759,779 B2 | 7/2010 | Okada et al. | |
| 7,781,250 B2 | 8/2010 | Wang et al. | |
| 2001/0050408 A1 | 12/2001 | Bernstein et al. | |
| 2002/0019069 A1 | 2/2002 | Wada | |
| 2003/0160185 A1* | 8/2003 | Homme | 250/483.1 |
| 2003/0230805 A1 | 12/2003 | Noma et al. | |
| 2004/0016983 A1* | 1/2004 | Misawa | 257/433 |
| 2004/0076797 A1* | 4/2004 | Zilber et al. | 428/137 |
| 2004/0108588 A1* | 6/2004 | Gilleo | 257/704 |
| 2004/0130640 A1 | 7/2004 | Fujimori | |
| 2004/0161920 A1 | 8/2004 | Noma | |
| 2004/0183152 A1* | 9/2004 | Yoneda et al. | 257/436 |
| 2004/0187916 A1* | 9/2004 | Hezel | 136/256 |
| 2004/0188699 A1* | 9/2004 | Kameyama et al. | 257/99 |
| 2005/0009238 A1 | 1/2005 | Okigawa | |
| 2005/0048740 A1 | 3/2005 | Noma et al. | |
| 2005/0077458 A1 | 4/2005 | Ma et al. | |
| 2005/0258447 A1* | 11/2005 | Oi et al. | 257/100 |
| 2006/0079019 A1 | 4/2006 | Kim | |
| 2007/0145590 A1 | 6/2007 | Noma et al. | |
| 2007/0210437 A1 | 9/2007 | Noma et al. | |
| 2008/0258258 A1 | 10/2008 | Horikoshi et al. | |
| 2008/0277793 A1 | 11/2008 | Noma et al. | |
| 2009/0026610 A1 | 1/2009 | Kitagawa et al. | |
| 2010/0038668 A1 | 2/2010 | Noma | |
| 2010/0164086 A1 | 7/2010 | Noma et al. | |

FOREIGN PATENT DOCUMENTS

| | | |
|---|---|---|
| JP | 9-321333 | 12/1997 |
| JP | 2000-349238 | 12/2000 |
| JP | 2001-085652 A | 3/2001 |
| JP | 2004-55674 | 2/2004 |
| JP | 2006-93367 | 4/2006 |
| KR | 10-2002-0048716 | 6/2002 |
| KR | 10-2004-0077472 | 9/2004 |
| KR | 10-2004-0092435 | 11/2004 |
| KR | 10-2005-0016041 | 2/2005 |
| WO | WO 99/40624 A1 | 8/1999 |
| WO | WO-2005/004195 | 1/2005 |

OTHER PUBLICATIONS

Noma, T. et al., U.S. Office Action, mailed Mar. 11, 2009 directed to a related U.S. Appl. No. 11/639,411; 11 pages.

European Search Report, mailed Jun. 10, 2009, directed to European Patent Application No. 06026027.0; 6 pages.

European Search Report, mailed Jun. 10, 2009, directed to European Patent Application No. 06026088.2; 5 pages.

Horikoshi, K. et al., U.S. Office Action mailed on Sep. 21, 2009, directed to a related U.S. Appl. No. 12/103,857; 13 pages.

Horikoshi, K. et al., U.S. Office Action, mailed Apr. 13, 2010, directed to a related U.S. Appl. No. 12/103,857; 12 pages.

Horikoshi, K. et al., U.S. Office Action mailed Jul. 23, 2010, directed to U.S. Appl. No. 12/103,857; 10 pages.

Kitagawa et al., U.S. Office Action mailed Sep. 15, 2010, directed to related U.S. Appl. No. 12/177,696; 12 pages.

Horikoshi, K. et al., U.S. Office Action, mailed Oct. 19, 2010, directed to a related U.S. Appl. No. 12/103,857; 9 pages.

Horikoshi, K. et al., U.S. Office Action, mailed Apr. 5, 2011, directed to a related U.S. Appl. No. 12/103,857; 12 pages.

* cited by examiner

SEMICONDUCTOR DEVICE

CROSS-REFERENCE OF THE INVENTION

This application claims priority from Japanese Patent Application Nos. 2005-361706 and 2006-310623, the contents of which are incorporated herein by reference in their entirety.

BACKGROUND OF THE INVENTION

1. Field of the Invention

The invention relates to a semiconductor device, particularly, a chip size package type semiconductor device having a light receiving element.

2. Description of the Related Art

A CSP (chip size package) has received attention in recent years as a new packaging technology. The CSP is a small package having about the same outside dimensions as those of a semiconductor die packaged in it.

A BGA (ball grid array) type semiconductor device has been known as a type of the CSP. In the BGA type semiconductor device, a plurality of ball-shaped conductive terminals made of metal such as solder is arrayed on one surface of a package and is electrically connected to a semiconductor die mounted on the other surface of the package.

When the BGA type semiconductor device is mounted on electronic equipment, the semiconductor die is electrically connected to an external circuit on a printed board by bonding the conductive terminals to wiring patterns on the printed board.

Such a BGA type semiconductor device has advantages in providing a large number of conductive terminals and in reducing a size over the other CSP type semiconductor devices such as an SOP (small outline package) and a QFP (quad flat Package), which have lead pins protruding from their sides. Therefore, the BGA type semiconductor device has a wide field of application.

FIG. 6A is a schematic cross-sectional view of a conventional BGA type semiconductor device having a light receiving element. A light receiving element 101 such as a CCD (charge coupled device) image sensor or a CMOS image sensor is provided on a front surface of a semiconductor substrate 100 made of silicon (Si) or the like, and a pad electrode 102 is further formed with a first insulation film 103 interposed therebetween. A light transparent substrate 104 made of, for example, glass, quartz or the like is further attached on the front surface of the semiconductor substrate 100 with a resin layer 105 made of epoxy resin or the like interposed therebetween. Furthermore, a second insulation film 106 made of a silicon oxide film or a silicon nitride film is formed on a side surface and a back surface of the semiconductor substrate 100.

Furthermore, a wiring layer 107 electrically connected to the pad electrode 102 is formed on the second insulation film 106 from the front surface to the back surface along the side surface of the semiconductor substrate 100. A protection layer 108 made of a solder resist or the like is formed covering the second insulation film 106 and the wiring layer 107. An opening is formed in a predetermined region of the protection layer 108 on the wiring layer 107, and a ball-shaped conductive terminal 109 is formed being electrically connected to the wiring layer 107 through this opening. The relevant technology is disclosed in Japanese Patent Application Publication No. 2002-512436.

In this conventional BGA type semiconductor device, however, when an infrared ray is used, there can be a case where an infrared ray passing through the light transparent substrate 104 also passes through the semiconductor substrate 100 and reaches the wiring layer 107 formed on the back surface of the semiconductor substrate 100, as shown by an arrow in FIG. 6A. Then, this infrared ray is reflected by the wiring layer 107 to travel upward (toward the light receiving element 101) and the light receiving element 101 receives the reflected light, thereby causing a problem that patterns 111 of the conductive terminal 109 and the wiring layer 107 are reflected on an output image 110 as shown in FIG. 6B.

SUMMARY OF THE INVENTION

The invention is made with consideration of the above problem, and its feature is as follows. That is, the invention provides a semiconductor device including: a semiconductor substrate formed with a light receiving element on its front surface; a light transparent substrate formed above the light receiving element and attached on the semiconductor substrate; a wiring layer formed on a back surface of the semiconductor substrate; and a reflection layer formed between the light receiving element and the wiring layer and reflecting an infrared ray toward the light receiving element, the infrared ray entering from the light transparent substrate toward the wiring layer through the semiconductor substrate.

In this semiconductor device, the reflection layer is formed only in a region overlapping the light receiving element.

In this semiconductor device, the wiring layer is formed along a side surface of the semiconductor substrate, and the reflection layer is formed along the side surface of the semiconductor substrate between the semiconductor substrate and the wiring layer.

The invention also provides a semiconductor device including: a semiconductor substrate formed with a light receiving element on its front surface; a light transparent substrate formed above the light receiving element and attached on the semiconductor substrate; a wiring layer formed on a back surface of the semiconductor substrate; and an anti-reflection layer formed between the light receiving element and the wiring layer and preventing transmission of an infrared ray entering from the light transparent substrate toward the wiring layer through the semiconductor substrate.

In this semiconductor device, the anti-reflection layer is formed only in a region overlapping the light receiving element.

In this semiconductor device, the wiring layer is formed along a side surface of the semiconductor substrate, and the anti-reflection layer is formed along the side surface of the semiconductor substrate between the semiconductor substrate and the wiring layer.

DETAILED DESCRIPTION OF THE INVENTION

A first embodiment of the invention will be described referring to figures. FIGS. 1A to 2C show cross-sectional views of semiconductor device intermediates at corresponding process steps.

Figure 1A:
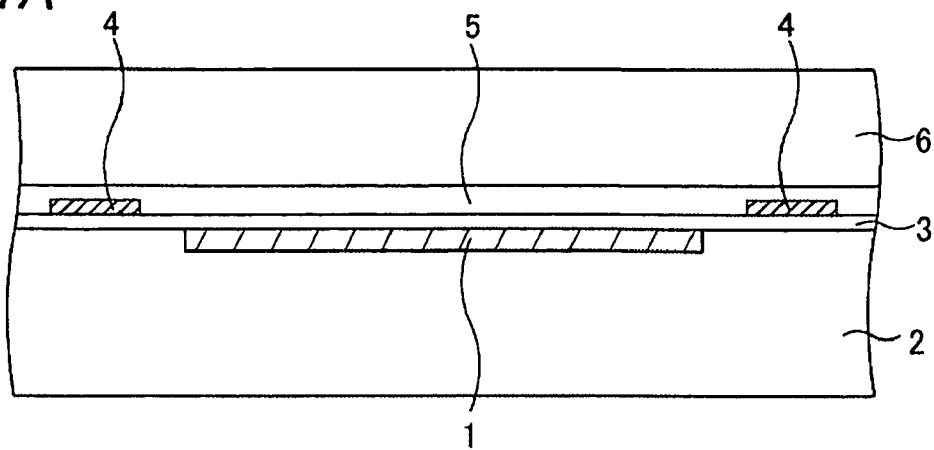
FIGS. 1A to 2C are cross-sectional views for explaining a semiconductor device and its manufacturing method of the invention.

First, as shown in FIG. 1A, a semiconductor substrate 2 made of silicon (Si) or the like is prepared, where a light receiving element 1 (e.g. an element such as a CCD sensor, a CMOS sensor, or an illumination sensor) that detects an infrared ray having a wavelength of about 700 nm to 2500 nm is formed on its front surface. Then, a first insulation film 3 (e.g. a silicon oxide film formed by a thermal oxidation method, a CVD method or the like) is formed on the front surface of the semiconductor substrate 2 to have a thickness of, for example, 2 μm.

Then, a metal layer of aluminum (Al), copper (Cu), or the like is formed by a sputtering method, a plating method, or the other deposition method, and the metal layer is etched using a photoresist layer (not shown) as a mask to form a pad electrode 4 having a thickness of, for example, 1 μm on the first insulation film 3. The pad electrode 4 is an external connection electrode electrically connected to the light receiving element 1 or the surrounding elements. Then, a passivation film (e.g. a silicon nitride film formed by a CVD method) (not shown) is formed on the front surface of the semiconductor substrate 2, covering a portion of the pad electrode 4.

Then, a light transparent substrate 6 is attached on the front surface of the semiconductor substrate 2 including on the pad electrode 4 with a resin layer 5 made of epoxy resin or the like interposed therebetween. The light transparent substrate 6 is made of a transparent or semitransparent material such as glass or quartz and has light transmission characteristics.

Then, back-grinding is performed to the back surface of the semiconductor substrate 2 to thin the semiconductor substrate 2 to a thickness of, for example, about 100 μm. There can be a case where the grinding process is not needed depending on applications or specifications of an end-product and the initial thickness of the prepared semiconductor substrate 2.

Figure 1B:
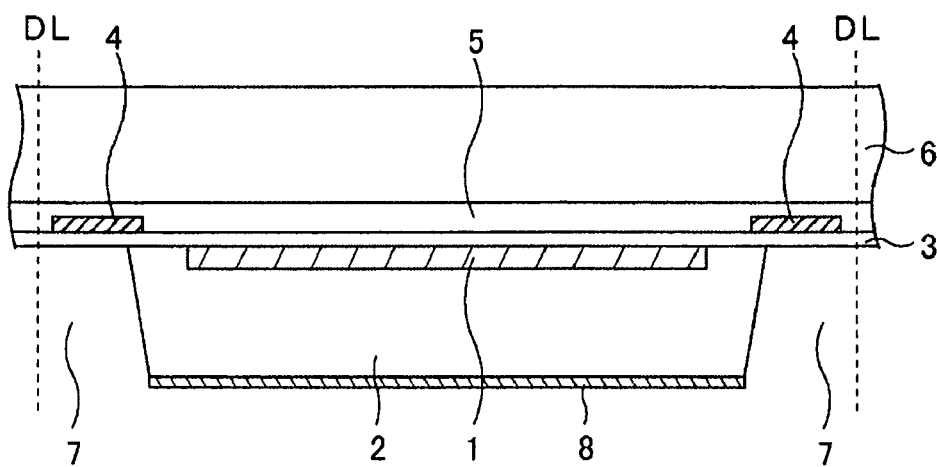

Then, as shown in FIG. 1B, a portion of the semiconductor substrate 2 in a position corresponding to the pad electrode 4 is selectively etched from the back surface of the semiconductor substrate 2 to expose the first insulation film 3 including the first insulation film 3 on a portion of the pad electrode 4. Hereafter, this exposed portion is called an opening 7. This opening 7 has a tapered shape of which the diameter is reducing from the back surface toward the front surface of the semiconductor substrate 2. It is also possible to form the opening 7 in a straight shape so that the side surface of the semiconductor substrate 2 is vertical to a main surface of the light transparent substrate 6 although not shown in the figure.

Then, a reflection layer 8 made of a metal material such as, for example, aluminum, gold, silver, or the like is formed on a back surface of the semiconductor substrate 2 by a CVD method, a sputtering method, or the other deposition method to have a thickness of, for example, about 0.1 to 2 μm. It is also possible to form the reflection layer 8 after the back grinding of the semiconductor substrate 2 and then selectively etch the reflection layer 8 and the semiconductor substrate 2.

The reflection layer 8 is a layer having a function of reflecting an infrared ray entering from the light transparent substrate 6 toward the back surface of the semiconductor substrate 2 through the semiconductor substrate 2 or an infrared ray entering from the back surface of the semiconductor substrate 2 toward the light receiving element 1 without further transmitting it therethrough, and its material is not particularly limited as long as it has such a function. It is also possible to form the reflection layer 8 uniformly on the whole back surface of the semiconductor substrate 2 or only under the light receiving element 1 as described below.

Figure 1C:
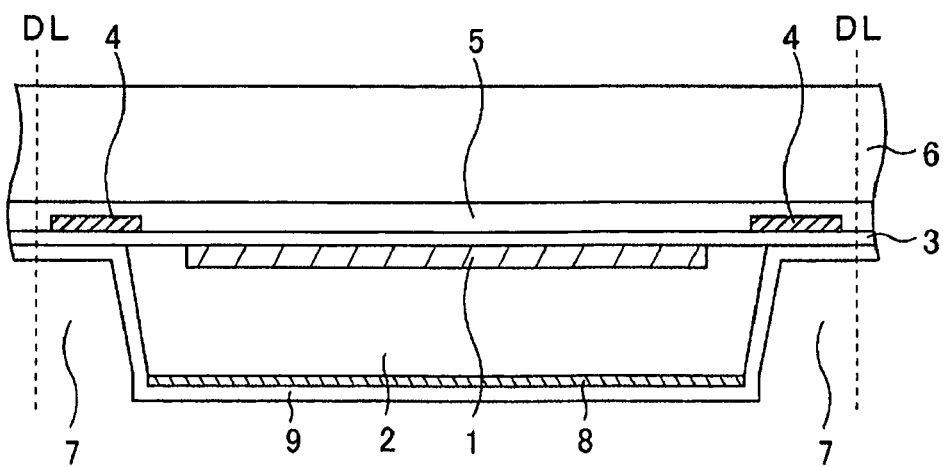

Next, as shown in FIG. 1C, a second insulation film 9 is formed on the side surface and back surface of the semiconductor substrate 2 including in the opening 7 and on the reflection layer 8. This second insulation film is a silicon oxide film or a silicon nitride film formed by, for example, a plasma CVD method.

Figure 2A:
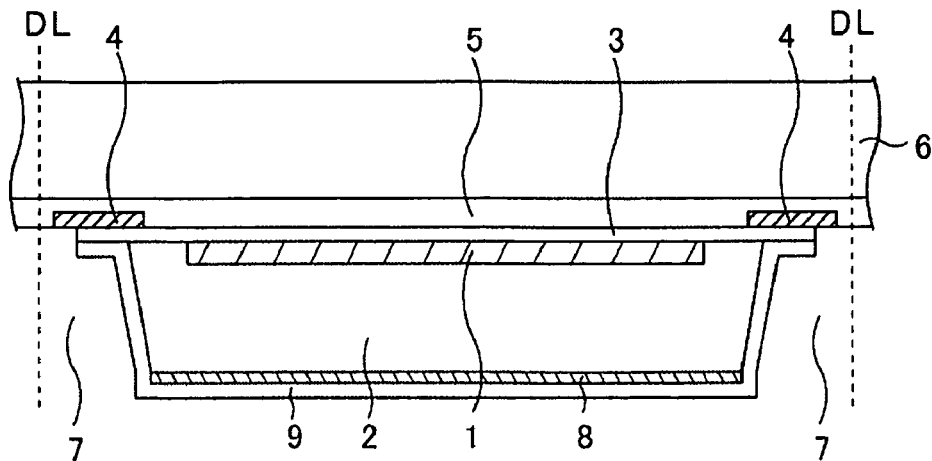

Then, as shown in FIG. 2A, the first insulation film 3 and the second insulation film 9 are selectively etched using a photoresist layer (not shown) as a mask. By this etching, the first insulation film 3 and the second insulation film 9 formed in a region from on a portion of the pad electrode 4 to a dicing line DL are removed to expose the portion of the pad electrode 4 at a bottom of the opening 7.

Figure 2B:
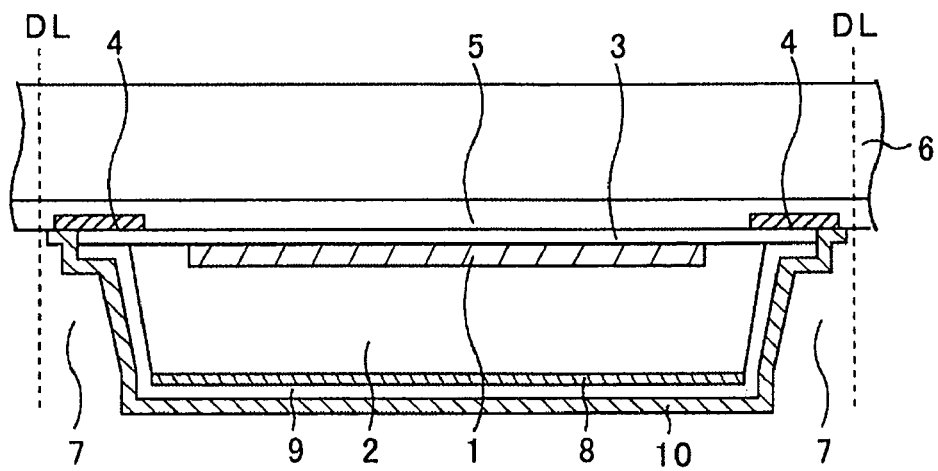

Next, a metal layer made of aluminum (Al), copper (Cu) or the like that is to be the wiring layer 10 is formed by a sputtering method, a plating method, or the other deposition method. Then, as shown in FIG. 2B, this is etched using a photoresist layer (not shown) as a mask to form the wiring layer 10 having a thickness of, for example, 1 μm on the portion of the pad electrode 4 and the second insulation film 9. It is preferable to form the reflection layer 8 and the wiring layer 10 with the same material (e.g. aluminum) by the same method (e.g. a sputtering method). This is because there are advantages that the manufacturing process is simplified and the manufacturing cost is minimized.

Figure 2C:
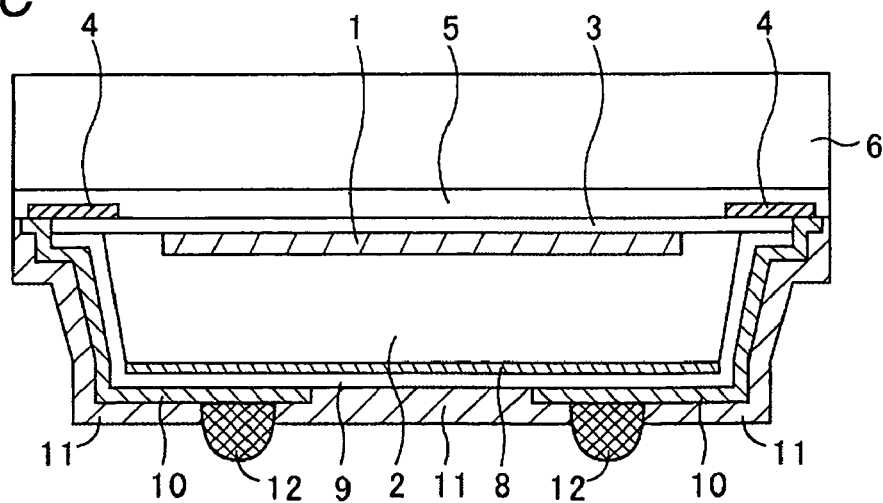

Next, the protection layer 11 made of a resist material such as a solder resist is formed on the back surface of the semiconductor substrate 2 including on the wiring layer 10 as shown in FIG. 2C. Then, an opening is formed in a predetermined region of the protection layer 11, an electrode connection layer (not shown) made of, for example, nickel, gold or the like is formed on the wiring layer 10 exposed in the opening, and the ball-shaped conductive terminal 12 made of solder or the like is formed thereon. When the protection layer 11 is made of a negative resist material, the protection layer 11 in a region irradiated with light is left as it is, and the protection layer 11 in a region irradiated with no light is removed to form the opening.

Wiring from the pad electrode 4 on the front surface of the semiconductor substrate 2 to the conductive terminal 12 formed on the back surface of the semiconductor substrate 2 along the sidewall of the semiconductor substrate 2 is thus realized in this manner. Then, dicing is performed along the dicing line DL that is a boundary of a number of semiconductor devices into individual separated semiconductor devices.

By the above described processes, the chip size package type semiconductor device having the light receiving element 1 is completed.

In the semiconductor device of the first embodiment, the reflection layer 8 is formed between the light receiving element 1 and the wiring layer 10 in a vertical direction, the reflection layer 8 reflecting an infrared ray toward the light receiving element 1 without transmitting it to the wiring layer 10, the infrared ray entering from the light transparent substrate 6 toward the wiring layer 10 through the semiconductor substrate 2. Therefore, an infrared ray entering from the light transparent substrate 6 and reaching the reflection layer 8 is all reflected by the reflection layer 8. Therefore, since the infrared ray is not reflected by the wiring layer 10 or the conductive terminal 12, any wiring pattern formed on the back surface of the semiconductor substrate 2 is prevented from being reflected on an output image. Furthermore, an infrared ray entering from the light transparent substrate 6 and reaching the reflection layer 8 is reflected toward the light receiving element 1, thereby providing an advantage that light strength of an infrared ray entering the light receiving element 1 increases to enhance the contrast of the output image.

Figure 3:
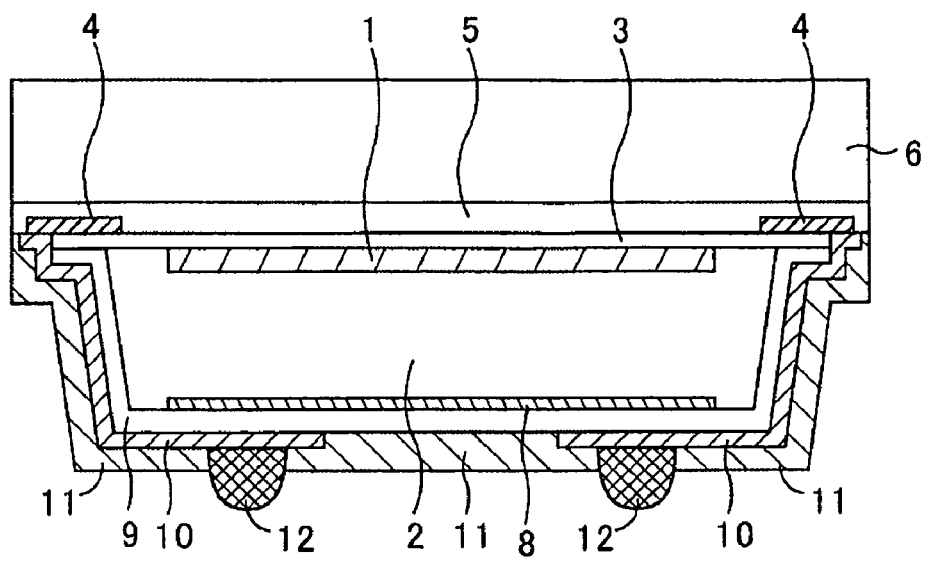
FIGS. 3 to 5, 7 and 8 are cross-sectional views for explaining the semiconductor device of the invention.

Furthermore, although the reflection layer 8 is uniformly formed on the back surface of the semiconductor substrate 2 in the above embodiment, it is also possible to form the reflection layer 8 on the back surface of the semiconductor substrate 2 only in a region overlapping the light receiving element 1 in the vertical direction or in a larger size than the light receiving element 1 over an end portion thereof by a predetermined amount, as shown in FIG. 3. This structure also prevents the pattern of the wiring layer 10 from being reflected toward the light receiving element 1 and prevents the pattern of the wiring on the back surface from being reflected on an output image, in the similar manner to the above embodiment.

Figure 7:
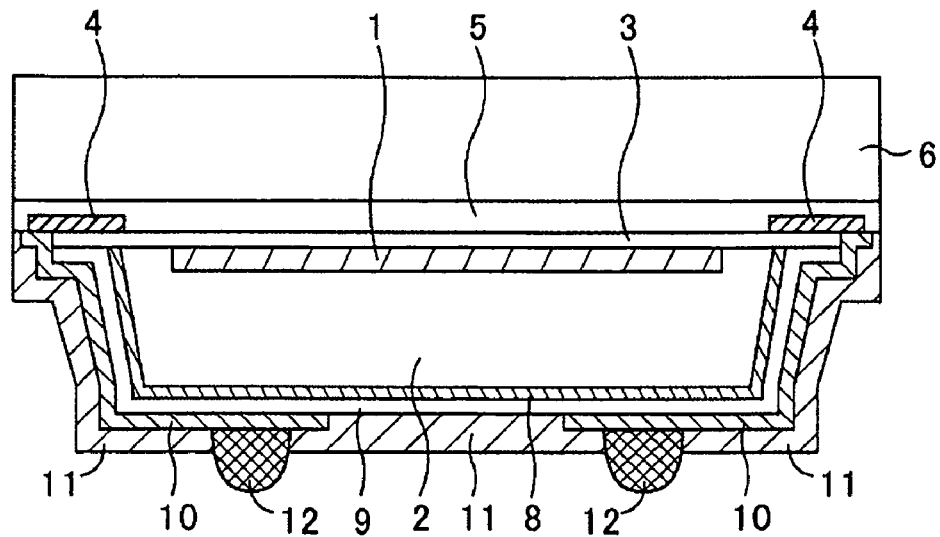

Although the reflection layer 8 is formed only on the back surface of the semiconductor substrate 2 in the above embodiment, it is also possible to form the reflection layer 8 so as to cover the whole side surface of the semiconductor substrate 2 as shown in FIG. 7. This structure prevents an infrared ray passing through the light transparent substrate 6 from being reflected by the wiring layer 10 formed along the side surface of the semiconductor substrate 2 toward the light receiving element 1. Therefore, the pattern of the wiring layer 10 formed along the side surface of the semiconductor substrate 2 is prevented from being reflected on an output image.

Furthermore, there can be a case where an infrared ray enters from various directions depending on a way of packaging the completed semiconductor device, so that the light receiving element 1 may mistakenly detect the infrared ray when the infrared ray enters the light receiving element 1 from the side surface of the semiconductor substrate 2. On the other hand, by covering the side surface and back surface of the semiconductor substrate 2 entirely with the reflection layer 8 as shown in FIG. 7, an infrared ray entering from the side surface and back surface of the semiconductor substrate 2 toward the light receiving element 1 is completely blocked. Therefore, the light receiving element 1 accurately receives only light from the light transparent substrate 6, thereby enhancing the detection accuracy of the light receiving element 1.

Figure 4:
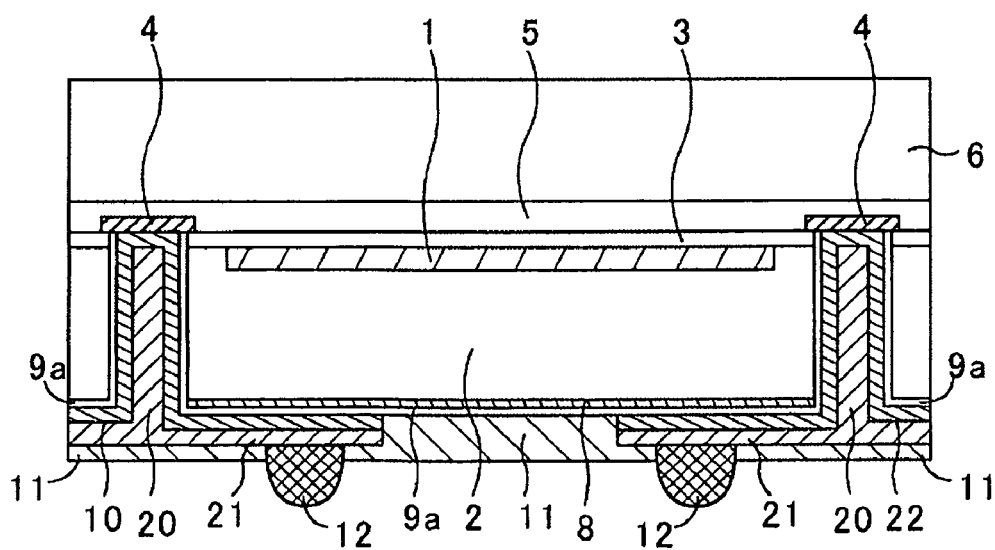

Furthermore, although the wiring layer 10 is formed from the pad electrode 4 along the side surface of the semiconductor substrate 2 in the above embodiment, the embodiment is applicable to any device as long as the wiring layer is formed on the back surface of the semiconductor substrate 2 therein. That is, for example, in a so-called penetrating electrode type semiconductor device formed with a penetrating electrode 20 made of metal such as aluminum or copper from the front surface to the back surface of the semiconductor substrate 2 and a wiring layer 21 and a ball-shaped conductive terminal 12 electrically connected to the penetrating electrode 20 on the back surface of the semiconductor substrate 2, it is also possible to form the reflection layer 8 between the wiring layer 21 and the light receiving element 1 including on the conductive terminal 12, as shown in FIG. 4. It is noted that a numeral 22 in FIG. 4 designates a barrier metal layer made of metal such as a titanium (Ti) layer, a titanium oxide ($TiO_2$) layer, a titanium nitride (TiN) layer, a tantalum nitride (TaN) layer or the like, for example. The same numerals are given to the same components as those of the above embodiment, and the description thereof will be omitted.

This penetrating electrode type semiconductor device is formed by, for example, preparing the semiconductor substrate 2 formed with the pad electrode 4 with the light receiving element 1 and the first insulation film 3 interposed therebetween, forming a via hole penetrating the semiconductor substrate 2 in a position corresponding to the pad electrode 4, forming the reflection layer 8 on the back surface of the semiconductor substrate 2, forming a second insulation film 9a covering a sidewall of the via hole and the back surface of the semiconductor substrate 2, removing the second insulation film 9a on a bottom of the via hole, forming the barrier metal layer 22 in the via hole, forming the penetrating electrode 20 made of metal such as copper in the via hole by, for example, an electrolytic plating method, forming the wiring layer 21 electrically connected to the penetrating electrode 20 on the back surface of the semiconductor substrate 2 by patterning, and forming the ball-shaped conductive terminal 12 and the protection layer 11. It is noted that the above described processes are an example of the method of manufacturing the penetrating electrode type semiconductor device of this embodiment, and the invention is not limited to these processes and the reflection layer 8 may be formed before forming the via hole, for example. It is possible to form the reflection layer 8 uniformly on the whole back surface of the semiconductor substrate 2 or only in a region overlapping the light receiving element 1 as already described above, although not shown.

Next, a semiconductor device of a second embodiment of the invention will be described referring to FIG. 5. It is noted that the same numerals are given to the same components as those of the first embodiment, and the description thereof will be omitted.

A feature of the semiconductor device of the second embodiment is that an anti-reflection layer 30 (e.g. a titanium nitride (TiN) layer formed by a sputtering method, a layer added with a pigment such as a black pigment, or an organic resin layer) is formed between the light receiving element 1 and the wiring layer 10 in a vertical direction to have a thickness of, for example, 1 to 2 μm. It is preferable that an infrared ray absorbent material such as, for example, a black pigment is mixed in the anti-reflection layer 30 for enhancing an anti-reflection effect. The anti-reflection layer 30 absorbs an infrared ray entering from the light transparent substrate 6 toward the wiring layer 10 through the semiconductor substrate 2, and has a function of preventing light transmission. The material and thickness of the anti-reflection layer are not particularly limited as long as it has this function.

In the semiconductor device of the second embodiment, an infrared ray entering from the light transparent substrate 6 and reaching the anti-reflection layer 30 is absorbed by the anti-reflection layer 30. This effectively prevents an infrared ray from being reflected toward the light receiving element 1 by the wiring layer 10. Even when an infrared ray is reflected, the amount is very small, thereby minimizing the reflection of the back surface wiring pattern on an output image.

Therefore, any pattern of the wiring layer 10 or the conductive terminal 12 formed on the back surface of the semiconductor substrate 2 is effectively prevented from being reflected on an output image.

Figure 5:
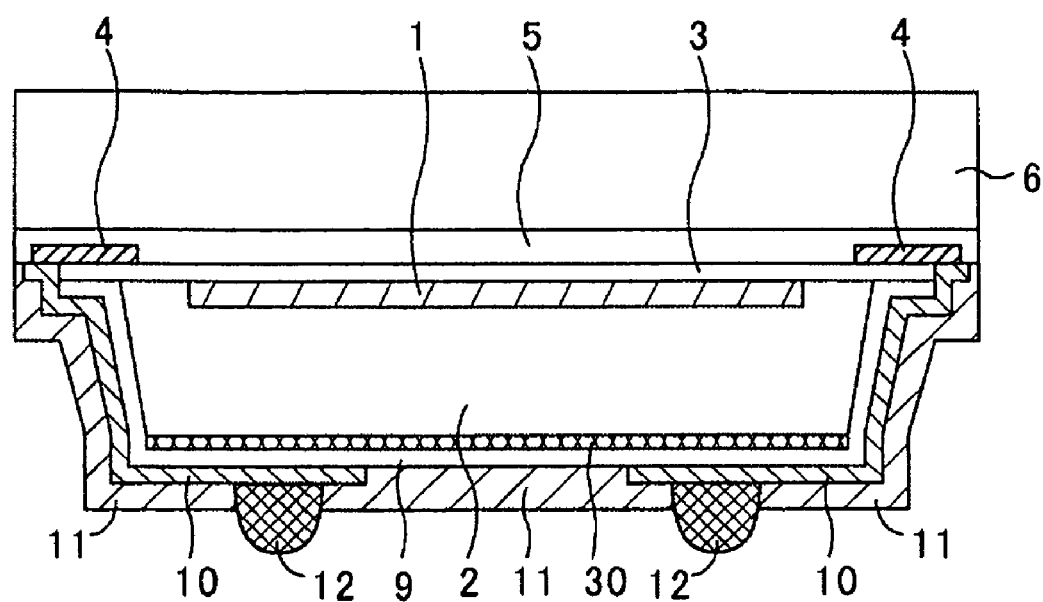
Figure 6A:
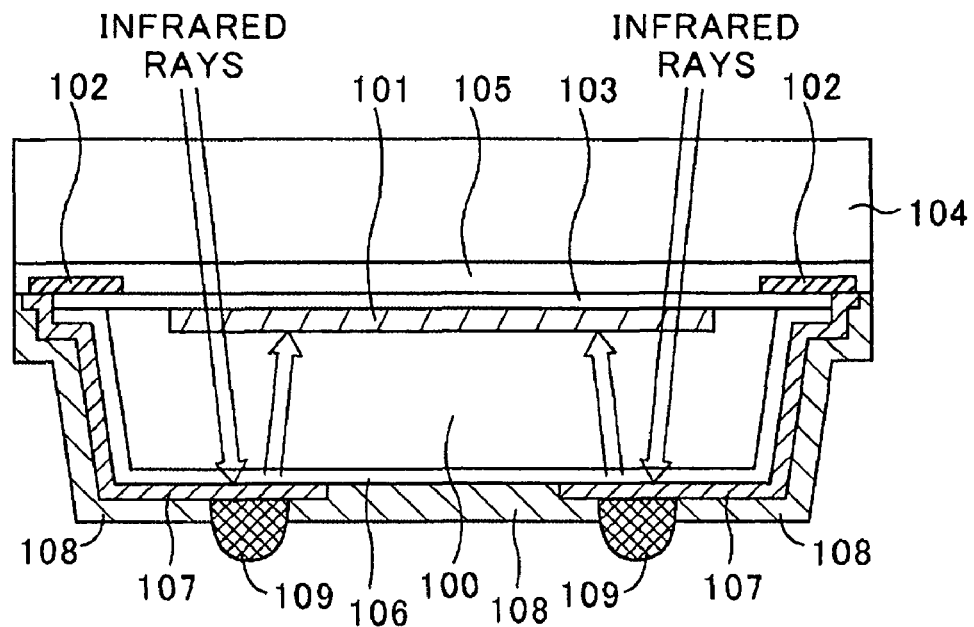
FIGS. 6A and 6B are cross-sectional views for explaining a conventional semiconductor device.
Figure 6B:
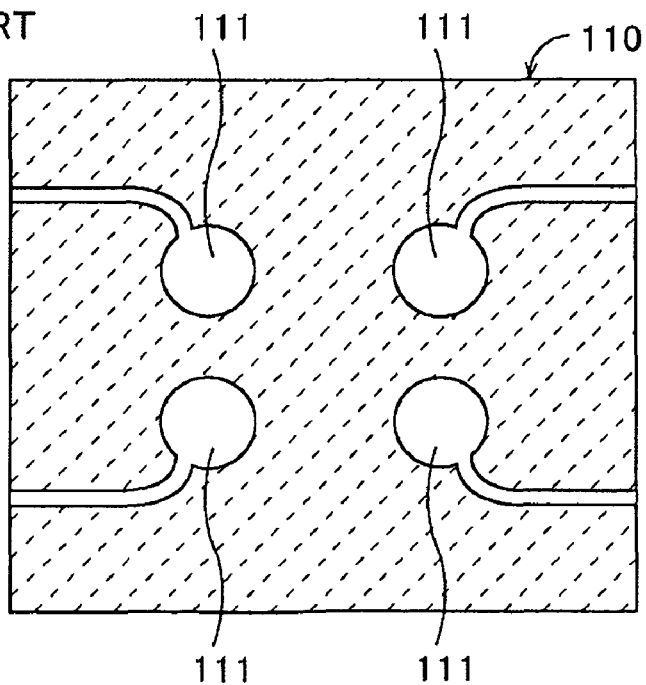

Furthermore, although the anti-reflection layer 30 is uniformly formed on the back surface of the semiconductor substrate 2 in FIG. 5, it is also possible to form the anti-reflection layer 30 on the back surface of the semiconductor substrate 2 only in a region overlapping the light receiving element 1 in a vertical direction or in a larger size than the light receiving element 1 over an end portion thereof by a predetermined amount, in the similar manner to the reflection layer 8 of the semiconductor device shown in FIG. 3.

Figure 8:
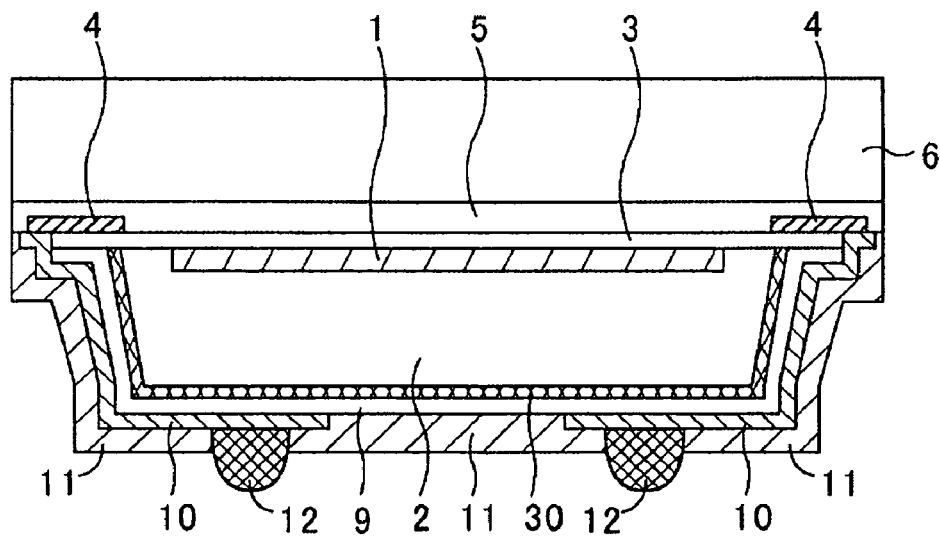

Furthermore, it is also possible to form the anti-reflection layer 30 covering the whole side surface of the semiconductor substrate 2, as shown in FIG. 8. This structure prevents an infrared ray passing through the light transparent substrate 6 from being reflected toward the light receiving element 1 by the wiring layer 10 formed along the side surface of the semiconductor substrate 2. This prevents the pattern of the wiring layer 10 formed along the side surface of the semiconductor substrate 2 from being reflected on an output image.

Furthermore, an infrared ray entering from the side surface of the semiconductor substrate 2 toward the light receiving element 1 is also absorbed by the anti-reflection layer 30, preventing light transmission. Therefore, in any packaging manner of the semiconductor device, the light receiving element 1 accurately receives only light entering from the light transparent substrate 6, thereby enhancing the detection accuracy of the light receiving element 1.

The second embodiment of the invention achieves wide application to semiconductor devices as long as those have the wiring layer formed on the back surface of the semiconductor substrate 2, and this is the same as the first embodiment. Therefore, this may be applied to the so-called penetrating electrode type semiconductor device shown in FIG. 4.

Although the description of the above embodiments is given for the BGA type semiconductor device having the ball-shaped conductive terminal, the invention may be applied to the LGA (land grid array) type semiconductor device.

The embodiments achieve prevention of reflection of the patterns of the conductive terminal and the wiring layer formed on the back surface of the semiconductor substrate on an output image.

What is claimed is:

1. A semiconductor device comprising:
a semiconductor substrate comprising a front surface and a back surface;
a light receiving element formed on the front surface of the semiconductor substrate;
a transparent substrate attached to the front surface of the semiconductor substrate so as to cover the light receiving element;
a wiring layer formed on the back surface of the semiconductor substrate;
a reflection layer formed on the back surface of the semiconductor substrate and located between the light receiving element and the wiring layer, the reflection layer being configured to reflect an infrared ray passing through the transparent substrate, the light receiving element or the semiconductor substrate back toward the light receiving element so that the light receiving element receives the reflected infrared ray; and
an inorganic film disposed between the reflection layer and the wiring layer so as to be in contact with both the reflection layer and the wiring layer.

2. The semiconductor device of claim 1, wherein the reflection layer is confined to an area of the back surface of the semiconductor substrate that is a projection of the light receiving element onto the back surface.

3. The semiconductor device of claim 1, wherein the reflection layer extends to cover a side surface of the semiconductor substrate, and the wiring layer and the inorganic film extend to cover a portion of the reflection layer covering the side surface of the semiconductor substrate so that the reflection layer is between the inorganic film and the side surface of the semiconductor substrate.

4. The semiconductor device of claim 1, wherein the reflection layer comprises a metal.

5. A semiconductor device comprising:
a semiconductor substrate comprising a front surface and a back surface;
a light receiving element formed on the front surface of the semiconductor substrate;
a transparent substrate attached to the front surface of the semiconductor substrate so as to cover the light receiving element;
a wiring layer formed on the back surface of the semiconductor substrate;
an anti-reflection layer formed on the back surface of the semiconductor substrate and located between the light receiving element and the wiring layer, the anti-reflection layer being made of a metal nitride and being configured to absorb an infrared ray; and
an inorganic film disposed between the anti-reflection layer and the wiring layer so as to be in contact with both the anti-reflection layer and the wiring layer,
wherein the anti-reflection layer extends to cover a side surface of the semiconductor substrate, and the wiring layer and the inorganic film extend to cover a portion of the anti-reflection layer covering the side surface of the semiconductor substrate so that the anti-reflection layer is between the inorganic film and the side surface of the semiconductor substrate.

6. The semiconductor device of claim 5, wherein the anti-reflection layer comprises an infrared ray absorbent material mixed therein.

7. A semiconductor device comprising:
a semiconductor substrate comprising a front surface, a side surface and a back surface;
a light receiving element formed on the front surface of the semiconductor substrate;
a transparent substrate attached to the front surface of the semiconductor substrate so as to cover the light receiving element;
a light-reflecting layer made of a metal and formed on the semiconductor substrate so as to cover the back surface and the side surface thereof;
an inorganic insulation film formed on the light-reflecting layer so as to cover the back surface and the side surface of the semiconductor substrate; and
a wiring layer formed on the inorganic insulation film so as to cover part of the back surface of the semiconductor substrate and part of the side surface of the semiconductor substrate,
wherein the inorganic insulation film is disposed between the light-reflection layer and the wiring layer so as to be in contact with both the light-reflection layer and the wiring layer.

8. The semiconductor device of claim 7, wherein the light-reflecting layer covers the entire back surface of the semiconductor substrate and the entire side surface of the semiconductor substrate.

9. The semiconductor device of claim 1, wherein the reflection layer is made of aluminum, gold or silver.

10. The semiconductor device of claim 7, wherein the metal is aluminum, gold or silver.

11. The semiconductor device of claim 3, wherein the reflection layer covers the back surface and the side surface of the semiconductor substrate entirely.

12. The semiconductor device of claim 5, wherein the anti-reflection layer covers the back surface and the side surface of the semiconductor substrate entirely.

* * * * *